(12) United States Patent
Ishibashi

(10) Patent No.: US 10,002,778 B2
(45) Date of Patent: Jun. 19, 2018

(54) SUBSTRATE CLEANING APPARATUS

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 63 days.

(21) Appl. No.: 14/736,036

(22) Filed: Jun. 10, 2015

(65) Prior Publication Data

US 2015/0352600 A1 Dec. 10, 2015

(30) Foreign Application Priority Data

Jun. 10, 2014 (JP) .................................. 2014-119724

(51) Int. Cl.
*H01L 21/67* (2006.01)
*B08B 1/00* (2006.01)
*B08B 1/04* (2006.01)
*B08B 11/02* (2006.01)

(52) U.S. Cl.
CPC ........ *H01L 21/67046* (2013.01); *B08B 1/001* (2013.01); *B08B 1/04* (2013.01); *B08B 11/02* (2013.01)

(58) Field of Classification Search
CPC ......... H01L 21/67092; H01L 21/67046; H01L 21/6704
USPC ............................................. 15/77; 134/902
See application file for complete search history.

(56) References Cited

U.S. PATENT DOCUMENTS

| 5,894,622 A * | 4/1999 | Manfredi .................. B08B 1/00 15/102 |
| 5,966,765 A * | 10/1999 | Hamada ............ H01L 21/67046 15/102 |
| 6,076,217 A | 6/2000 | Brunelli et al. |

(Continued)

FOREIGN PATENT DOCUMENTS

| JP | H10-180198 A | 7/1998 |
| JP | 2000-040684 A | 2/2000 |

(Continued)

OTHER PUBLICATIONS

Japan Patent Application No. 2014-119724; Reasons for Refusal; dated Jan. 9, 2018; 7 pages.

(Continued)

*Primary Examiner* — Laura C Guidotti
(74) *Attorney, Agent, or Firm* — Baker & Hostetler LLP

(57) ABSTRACT

A substrate cleaning apparatus includes outer circumference supporting members 32 that support the outer circumference of a rotating substrate W, a swing cleaning member 34 that swings between a first peripheral position B and a second peripheral position B' of the substrate W while passing a center portion A of the substrate W to clean a front surface of the rotating substrate W, and an elongated supporting member 36 that extends long from a third peripheral position C to a fourth peripheral position C' of the substrate W so as to pass the center portion A and supports the rear surface of the rotating substrate W. The first peripheral position B is disposed between a position D of the outer circumference supporting member 32 of the plurality of outer circumference supporting members 32 and closest to the third peripheral position C and the third peripheral position C.

7 Claims, 18 Drawing Sheets

(56) References Cited

U.S. PATENT DOCUMENTS

| | | | | |
|---|---|---|---|---|
| 6,158,075 | A * | 12/2000 | Tanaka | B08B 1/007 134/6 |
| 6,412,134 | B1 * | 7/2002 | Oikawa | B08B 1/04 15/102 |
| 6,438,781 | B1 * | 8/2002 | Ritchey, Jr. | B08B 1/04 134/140 |
| 2002/0004962 | A1 | 1/2002 | Oikawa et al. | |
| 2002/0096191 | A1 * | 7/2002 | Lofaro | H01L 21/67046 134/6 |
| 2013/0213437 | A1 | 8/2013 | Ishii et al. | |

FOREIGN PATENT DOCUMENTS

| | | |
|---|---|---|
| JP | 2002-001238 A | 1/2002 |
| JP | 2002-028584 A | 1/2002 |
| JP | 2013-172019 A | 9/2013 |

OTHER PUBLICATIONS

Japan Patent Application No. 2014-119724; Decision to Grant; dated Feb. 27, 2018; 6 pages.

* cited by examiner

FIG.7
(a)
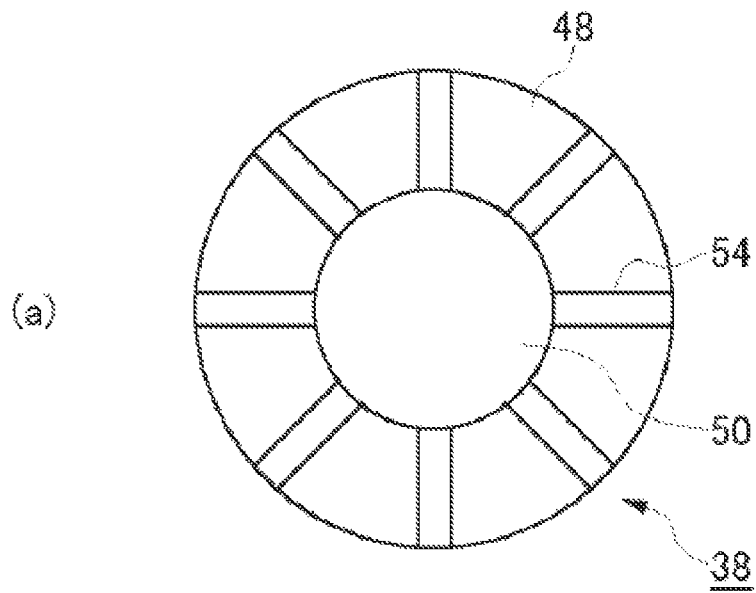
(b)
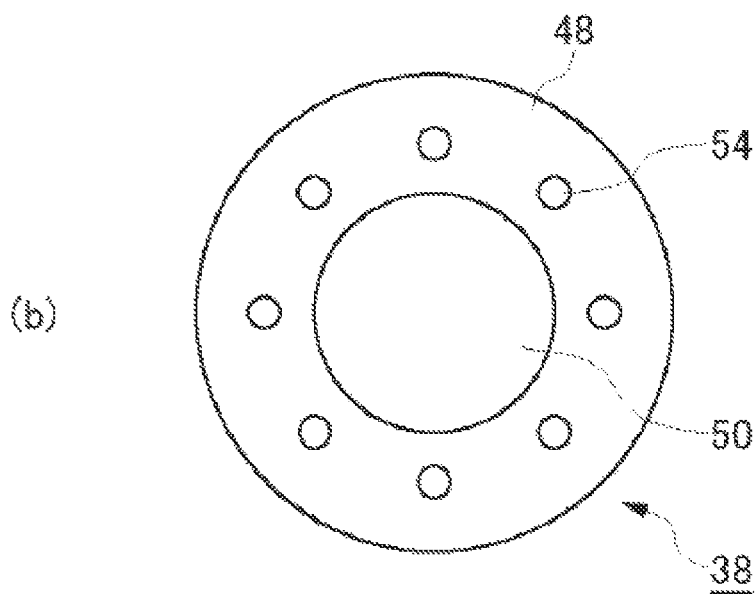

SUBSTRATE CLEANING APPARATUS

CROSS-REFERENCE TO RELATED APPLICATIONS

This application claims the benefit of Japanese Priority Patent Application JP 2014-119724 filed on Jun. 10, 2014, the entire contents of which are incorporated herein by reference.

FIELD

This technology relates to a substrate cleaning apparatus that cleans a substrate by using a swing cleaning member, particularly to a substrate cleaning apparatus suitable for cleaning a substrate having a large diameter.

BACKGROUND AND SUMMARY

Recently, as semiconductor devices have been more miniaturized, substrates having a fine structure (substrates in which various material films having different physical properties are formed) are processed. For example, in a damascene wiring forming process in which a wiring groove formed in a substrate is filled with metal, excess metal is, after the damascene wiring forming, polished and removed by a substrate polishing apparatus (CMP apparatus) to form various material films having a different physical property in a substrate front surface (a metal film, a barrier film, an insulating film and the like). Such a substrate front surface has a slurry residue and a metal polishing waste (such as a Cu polishing waste) that were used and left in the CMP polishing. Accordingly, when a substrate front surface is not sufficiently cleaned, such as when a substrate front surface is complex and difficult to clean, leakage and/or poor adhesiveness may occur according to the effect of the residue or the like, causing reliability to lower. Then, in the CMP apparatus that polishes a semiconductor substrate, roll scrub cleaning or pen scrub cleaning is carried out in a cleaning process after polishing. For example, Japanese Patent Laid-Open No. 2013-172019 describes such a technology.

In a conventional substrate cleaning apparatus, for example, a substrate front surface is cleaned while rotating the substrate placed flat in the horizontal direction. When a substrate is simply placed flat in the horizontal direction, the substrate becomes warped (into a concave shape) due to its own weight. The warped shape due to substrate's own weight, unfortunately, is more conspicuous as a substrate diameter becomes larger. For example, if a substrate diameter becomes 1.5 times larger (from 300 mm to 450 mm), a warpage amount in the central portion of the substrate becomes 2 to 3 times greater.

Also, when a substrate front surface is cleaned by pen scrub cleaning, the substrate is cleaned by a cleaning member that swings on the substrate front surface. In such a situation, when the cleaning member passes the central portion of the substrate front surface, if there is not a supporting member in the substrate rear surface, the substrate also becomes warped due to a pressing force by the cleaning member. This problem with the warped shape caused from the pressing force by the cleaning member may occur also when the substrate is placed vertically or obliquely, not limited to when the substrate is placed flat in the horizontal direction.

Once a substrate becomes warped, a variation in cleaning characteristic may occur between the central portion and the outer circumferential portion of the substrate. For example, if a substrate is placed flat in the horizontal direction, a scrubbing solution is discharged by centrifugal force generated by rotating the substrate, but if the central portion of the substrate becomes concave, discharging performance of the scrubbing solution lowers. The problem that the discharging performance of the scrubbing solution lowers has particularly a large effect on rinsing after cleaning by using a medical solution, accordingly, a margin in an integrated cleaning process may be reduced, a throughput may be lowered due to a long time processing and a high cost may be incurred because of consumption material.

Furthermore, once a substrate becomes warped, a variation in cleaning characteristic may occur between the central portion and the outer circumferential portion of the substrate also when pen scrub cleaning is carried out. That is, once a substrate becomes warped, a pressing force by a cleaning member lowers in the central portion of the substrate, and the cleaning characteristic may deteriorate in the central portion of the substrate (where a whirl speed is low). Then, if the pressing force by the cleaning member is simply strengthened, a corner of the cleaning member comes into contact with the outer circumferential portion of the substrate (where a whirl speed is high) and back contamination may increase.

Therefore, it has been desired to provide a substrate cleaning apparatus that can prevent a substrate from becoming warped when the substrate is cleaned by using a swing cleaning member.

A substrate cleaning apparatus of one embodiment includes a plurality of outer circumference supporting members that support outer circumference of a substrate; a swing cleaning member that swings between a first peripheral position and a second peripheral position of the substrate while passing a center portion of the substrate to clean a front surface of the substrate; and an elongated supporting member that extends long from a third peripheral position and a fourth peripheral position of the substrate so as to pass the center portion of the substrate and supports the rear surface of the rotating substrate, wherein one of the first peripheral position and the second peripheral position is disposed between a position of an outer circumference supporting member closest to the third peripheral position and the third peripheral position, or between a position of an outer circumference supporting member closest to the fourth peripheral position and the fourth peripheral position.

A substrate cleaning apparatus of another embodiment includes a plurality of outer circumference supporting members that support outer circumference of a substrate; a cleaning member for oscillating from/to an first peripheral position of the substrate through a center portion of the substrate to clean a front surface of the substrate; and an elongated supporting member that extends long from a third peripheral position and a fourth peripheral position of the substrate so as to pass the center portion of the substrate and supports the rear surface of the substrate, wherein the first peripheral position is disposed between a position of an outer circumference supporting member closest to the third peripheral position and the third peripheral position, or between a position of an outer circumference supporting member closest to the fourth peripheral position and the fourth peripheral position.

A cleaning sponge of the other embodiment includes a body portion having a lower surface thereof, the lower surface being to be contacted with the front surface of the substrate; and a neck portion to be provided to stand on an upper surface of the body portion; wherein at least one of a recess in a root end portion of the neck portion, a concave portion in the upper surface of the body portion, or a convex portion in the upper surface of the body portion is provided.

BRIEF DESCRIPTION OF THE DRAWINGS

FIG. 7 is a plan view of the cleaning sponge in the one embodiment;

DETAILED DESCRIPTION OF NON-LIMITING EXAMPLE EMBODIMENTS

Figure 1:
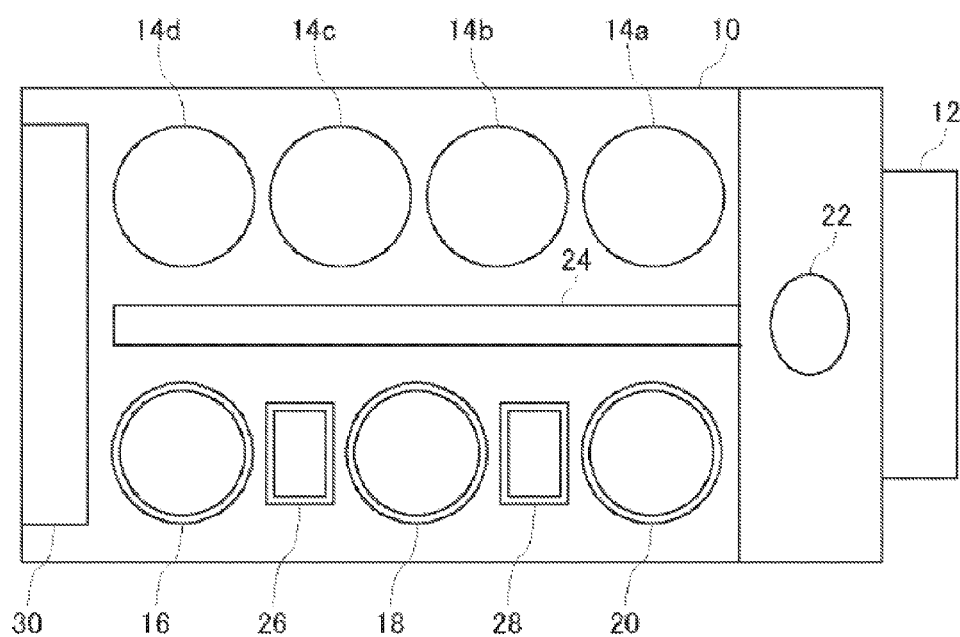
FIG. 1 is a plan view of a substrate processing apparatus including a substrate cleaning apparatus (cleaning unit) in one embodiment.

Now, a substrate cleaning apparatus of an embodiment will be described. Note that an embodiment to be described below shows one example where this technology is implemented, and this technology should not be limited to a specific configuration to be described below. When this technology is implemented, a specific configuration may be appropriately adopted depending on an embodiment.

A substrate cleaning apparatus of one embodiment includes a plurality of outer circumference supporting members that support the outer circumference of a rotating substrate, a swing cleaning member that swings between a first peripheral position and a second peripheral position of the substrate while passing a center portion of the substrate to clean a front surface of the rotating substrate, and an elongated supporting member that extends long from a third peripheral position to a fourth peripheral position of the substrate so as to pass the center portion of the substrate and supports the rear surface of the rotating substrate, in which at least one of the first peripheral position and the second peripheral position is disposed between a position of the outer circumference supporting member of the plurality of outer circumference supporting members and closest to the third peripheral position and the third peripheral position, or between a position of the outer circumference supporting member of the plurality of the outer circumference supporting members and closest to the fourth peripheral position and the fourth peripheral position.

According to this configuration, the swing cleaning member that cleans the front surface of a substrate swings between the first peripheral position and the second peripheral position while passing the center of the substrate. The elongated supporting member that supports the rear surface of the substrate extends long from the third peripheral position to the fourth peripheral position so as to pass the center portion of the substrate. Therefore, when the swing cleaning member is situated at the center portion of the substrate, the substrate is supported by the elongated supporting member and can be prevented from becoming warped (into a concave shape). Also, in such a situation, at least one of the first peripheral position and the second peripheral position is disposed between the position of the outer circumference supporting member of the plurality of outer circumference supporting members and closest to the third peripheral position and the third peripheral position, or between the position of the outer circumference supporting member of the plurality of outer circumference supporting members and closest to the fourth peripheral position and the fourth peripheral position. Therefore, also when the swing cleaning member is situated between the center portion and the outer circumferential portion of the substrate (at least one of the first peripheral position and the second peripheral position), the substrate is supported by the elongated supporting member and the outer circumference supporting member (the outer circumference supporting member closest to the third peripheral position or the fourth peripheral position), so that the degree to which the substrate becomes warped (into a concave shape) can be lowered.

Also, in the above substrate cleaning apparatus, an angle formed between a line segment AB connecting a center position A and a first peripheral position B of a substrate and a line segment AC connecting the center position A and a third peripheral position C of the substrate may be set to be not greater than an angle formed between a line segment AD connecting the center position A of the substrate and a position D of the outer circumference supporting member and closest to the third peripheral position and the line segment AC connecting the center position A and the third peripheral position C of the substrate.

According to this configuration, when the swing cleaning member is situated at the center position A of the substrate, the substrate is supported by the elongated supporting member and can be prevented from becoming warped (into a concave shape). Furthermore, also when the swing cleaning member is situated between the center position A of the substrate and the first peripheral position B, the substrate is supported by the elongated supporting member and the outer circumference supporting member (the outer circumference supporting member closest to the third peripheral position), so that the degree to which the substrate becomes warped (into a concave shape) can be lowered.

Also, in the above substrate cleaning apparatus, the swing cleaning member is a pencil scrub cleaning member and the pencil scrub cleaning member includes a cleaning sponge that contacts with the front surface of a substrate and a holding member that holds the cleaning sponge, in which the cleaning sponge includes a body portion whose lower surface contacts with the front surface of the substrate and a neck portion that is provided to stand on an upper surface of the body portion and is held by the holding member, in which in a root end portion of the neck portion, a recess is provided, and in the upper surface of the body portion, a concave portion or a convex portion may be provided.

According to this configuration, in the cleaning sponge of the pencil scrub cleaning member, the recess is provided in the root end portion of the neck portion, accordingly, the neck portion easily deforms so as to fall on the body portion. That is, the cleaning sponge is configured so that the lower surface of the body portion easily deforms so as to tilt in the state where the neck portion is held by the holding member. When a substrate becomes warped (into a concave shape), a tilt of the front surface of the substrate occurs, but in such a situation, the lower surface of the body portion in the cleaning sponge tilts so that the cleaning sponge can follow the tilt of the front surface of the substrate, allowing a partial contact of the cleaning sponge with the front surface of the substrate to be suppressed.

Also, in the above substrate cleaning apparatus, the swing cleaning member is a pencil scrub cleaning member and the pencil scrub cleaning member includes a cleaning sponge that contacts with the front surface of a substrate and a holding member that holds the cleaning sponge, in which the cleaning sponge includes a body portion whose lower surface contacts with the front surface of the substrate and a neck portion that is provided to stand on an upper surface of the body portion and is held by the holding member, and in the upper surface of the body portion, a concave portion or a convex portion may be provided.

According to this configuration, because in the cleaning sponge of the pencil scrub cleaning member, the concave portion or the convex portion is provided in the upper surface of the body portion, the body portion easily deforms so as to warp. When a substrate becomes warped (into a concave shape), a tilt of the front surface of the substrate occurs, but in such a situation, the body portion of the cleaning sponge deforms so as to warp so that the cleaning sponge can follow the tilt of the front surface of the substrate, allowing a partial contact of the cleaning sponge with the front surface of the substrate to be suppressed.

Also, in the above substrate cleaning apparatus, the elongated supporting member is a roll member, and in a front surface of the roll member, a plurality of convex portions are provided, in which an outermost convex portion of the plurality of convex portions may be situated on the inside of the outer circumferential portion of a substrate.

According to this configuration, the outermost convex portion of the plurality of convex portions in the front surface of the roll member (the outermost convex portion) is situated on the inside of the outer circumferential portion of a substrate, which can prevent the outer circumferential portion of the substrate from partially contacting with the convex portion (the outermost convex portion). The outer circumferential portion of the substrate partially contacts with the convex portion (the outermost convex portion), thereby depressing the portion in the front surface of the convex portion and with which the outer circumferential portion of the substrate contacts (the outermost convex portion), eventually a step is formed in the front surface of the convex portion (the outermost convex portion). Once the step is formed in the front surface of the convex portion (the outermost convex portion) and the portion that does not contact with the outer circumferential portion of the substrate protrudes above the substrate, then the swing cleaning member may be blocked by the protruding portion of this convex portion (the outermost convex portion) when the substrate is cleaned to the outer circumferential portion by the swing cleaning member. According to this technology, the outer circumferential portion of the substrate can be prevented from partially contacting with the convex portion (the outermost convex portion), allowing the substrate to be cleaned to the outer circumference without blocking the swing cleaning member.

Also, in the above substrate cleaning apparatus, to make constant pressure by the swing cleaning member on a substrate when the swing cleaning member protrudes from the outer circumference of the substrate, a control portion may be provided that controls a pressing force by the swing cleaning member on the substrate depending on an area of the swing cleaning member that contacts with the substrate.

According to this configuration, the pressing force by the swing cleaning member on the substrate is controlled depending on an area of the swing cleaning member that contacts with the substrate when the swing cleaning member protrudes from the outer circumference of the substrate, so that the pressure by the swing cleaning member on the substrate is kept constant. Therefore, the swing cleaning member can be prevented from breaking into the substrate due to an increased pressure, allowing the substrate to be cleaned to the outer circumference.

Furthermore, in the above substrate cleaning apparatus, the elongated supporting member includes a first rotary roll member from the center portion to the third peripheral position of a substrate and a second rotary roll member from the center portion to the fourth peripheral position of the substrate, in which a rotation direction of the first rotary roll member and a rotation direction of the second rotary roll member may be set to be the same direction as a rotation direction of the substrate.

According to this configuration, because the elongated supporting member includes the first rotary roll member and the second rotary roll member, and the rotation direction of the first rotary roll member and the rotation direction of the second rotary roll member is set to be the same direction as the rotation direction of the substrate, the substrate can be smoothly rotated without blocking rotation of the substrate.

According to the above substrate cleaning apparatus, when a substrate is cleaned by using the swing cleaning member, the substrate can be prevented from becoming warped.

Now, a substrate cleaning apparatus of an embodiment of the invention will be described below with reference to the drawings. This embodiment illustrates a substrate cleaning apparatus used in a CMP apparatus or the like that polishes a semiconductor substrate.

A configuration of the substrate cleaning apparatus of the embodiment of the invention will be described with reference to the drawings. FIG. 1 is a plan view illustrating a whole configuration of a substrate processing apparatus including the substrate cleaning apparatus (cleaning unit) according to the embodiment of the invention. As shown in FIG. 1, the substrate processing apparatus includes an about rectangular housing 10 and a load port 12 on which a substrate cassette to stock many substrates such as a semiconductor wafer is mounted. The load port 12 is disposed adjacent to the housing 10. On the load port 12, an open cassette, an SMIF (Standard Manufacturing Interface) pod or a FOUP (Front Opening Unified Pod) can be mounted. The SMIF and the FOUP house the substrate cassette therein and are a closed container in which the environment can be kept independent of the external space by covering the container with a partition wall.

The housing 10 houses four polishing units 14a to 14d, cleaning units (first cleaning unit 16 and second cleaning unit 18) that clean a polished substrate and a drying unit 20 that dries a cleaned substrate, therein. Each cleaning unit (first cleaning unit 16, second cleaning unit 18) may have an upper and lower two-tier structure having two stages disposed one above the other. The polishing units 14a to 14d are arrayed along a longitudinal direction of the substrate processing apparatus, and also the cleaning units 16, 18 and the drying unit 20 are arrayed along the longitudinal direction of the substrate processing apparatus. The substrate cleaning apparatus of the embodiment of the invention is applicable to the first cleaning unit 16 and the second cleaning unit 18.

In a region surrounded by the load port 12, and the polishing unit 14a and the drying unit 20 situated on the load port 12 side, a first substrate transfer robot 22 is disposed, also a substrate transport unit 24 is disposed parallel to the polishing units 14a to 14d. Furthermore, the first substrate transfer robot 22 receives a substrate prior to polishing from the load port 12 and delivers it to the substrate transport unit 24, and also receives a dried substrate from the drying unit 20 and returns it to the load port 12. The substrate transport unit 24 transports the substrate received from the first substrate transfer robot 22 and performs delivery and receipt of the substrate between each of the polishing units 14a to 14d.

Between the first cleaning unit 16 and the second cleaning unit 18, a second substrate transfer robot 26 is disposed that performs delivery and receipt of a substrate between each of these units 16, 18. Also, between the second cleaning unit 18 and the drying unit 20, a third substrate transfer robot 28 is disposed that performs delivery and receipt of a substrate between each of these units 18, 20. Furthermore, in the inside of the housing 10, a control portion 30 is disposed that controls operation of each device in the substrate processing apparatus. The control portion 30 controls operation of, for example, the cleaning units (first cleaning unit 16, second cleaning unit 18).

Figure 2:
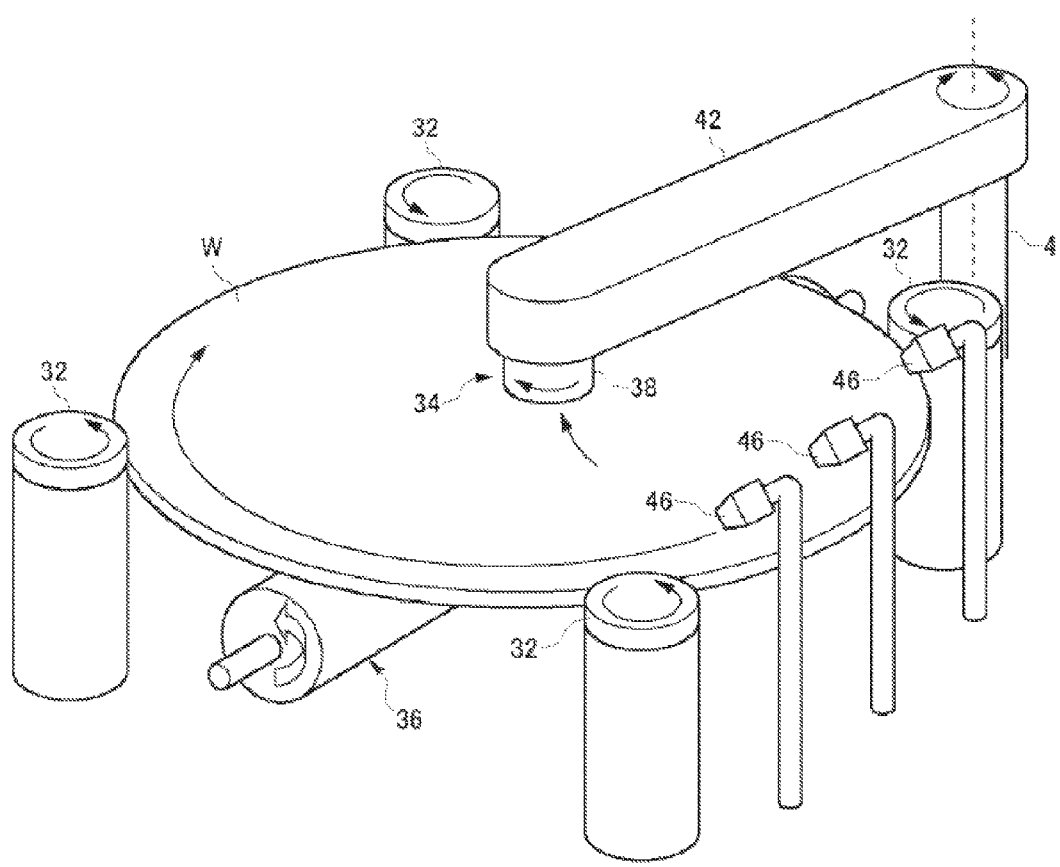
FIG. 2 is a perspective view of the substrate cleaning apparatus (cleaning unit) in the one embodiment.
Figure 3:
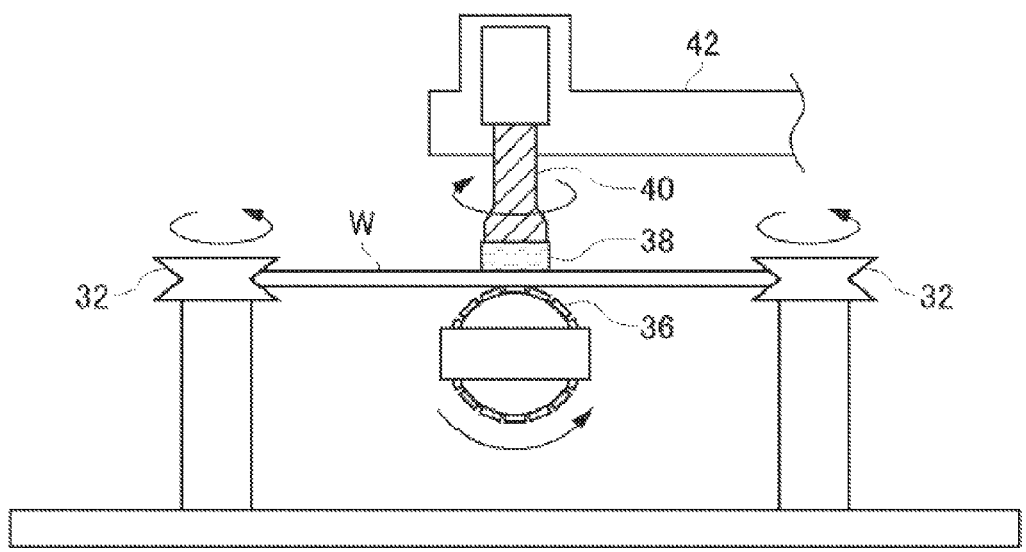
FIG. 3 is a side view of the substrate cleaning apparatus (cleaning unit) in the one embodiment.
Figure 4:
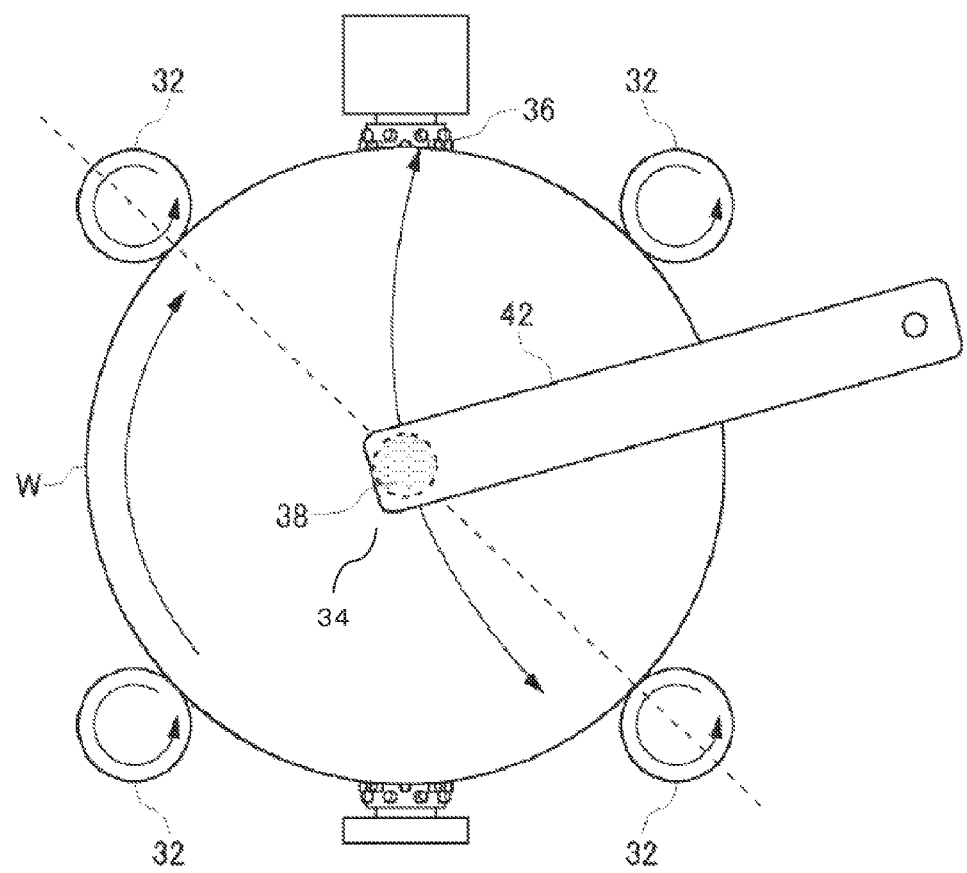
FIG. 4 is a plan view of the substrate cleaning apparatus (cleaning unit) in the one embodiment.

FIG. 2 is a perspective view illustrating a configuration of the substrate cleaning apparatus (cleaning unit) of this embodiment. Also, FIG. 3 is a side view illustrating the configuration of the substrate cleaning apparatus (cleaning unit) and FIG. 4 is a plan view illustrating the configuration of the substrate cleaning apparatus (cleaning unit). As shown in FIGS. 2 to 4, the substrate cleaning apparatus includes four outer circumference supporting members 32 that support the outer circumference of a substrate W, a swing cleaning member 34 that cleans the front surface of the substrate W and an elongated supporting member 36 that supports the rear surface of the substrate W.

The outer circumference supporting member 32 includes, for example, a chuck or the like. Rotation of the chuck or the like can cause the substrate W to rotate. The swing cleaning member 34 is configured so that it swings on the substrate W in an arc-like manner to clean the front surface of the substrate W. Also, the elongated supporting member 36 extends long and is configured to support the rear surface of the substrate W while rotating. Note that the elongated supporting member 36 may be configured to support the rear surface of the substrate W without rotating.

The swing cleaning member 34 includes, for example, a pencil scrub cleaning member. The pencil scrub cleaning member includes a cleaning sponge 38 that contacts with the front surface of the substrate W while rotating and a holding member 40 that holds the cleaning sponge 38 (see FIGS. 5 and 6). The holding member 40 is provided in the tip of a swinging arm 42. The root tip of the swinging arm 42 is supported by a rotatable support shaft 44. Also, lateral to the substrate cleaning apparatus, a nozzle 46 is provided to stand and supply a scrubbing solution (medical solution) and a slurry.

Figure 5:
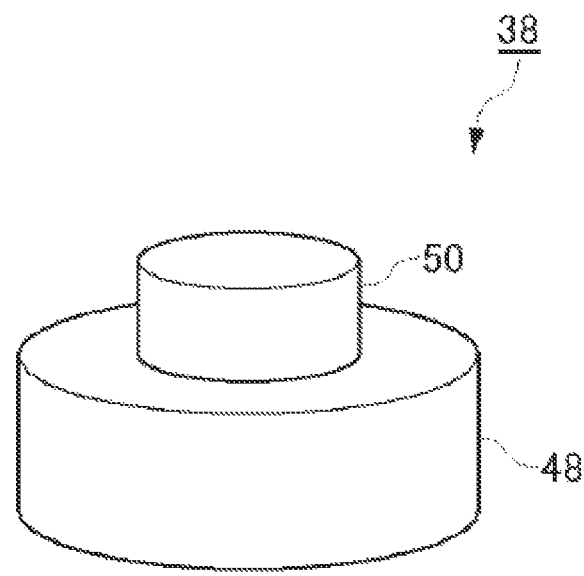
FIG. 5 is a perspective view of a cleaning sponge in one embodiment.
Figure 6:
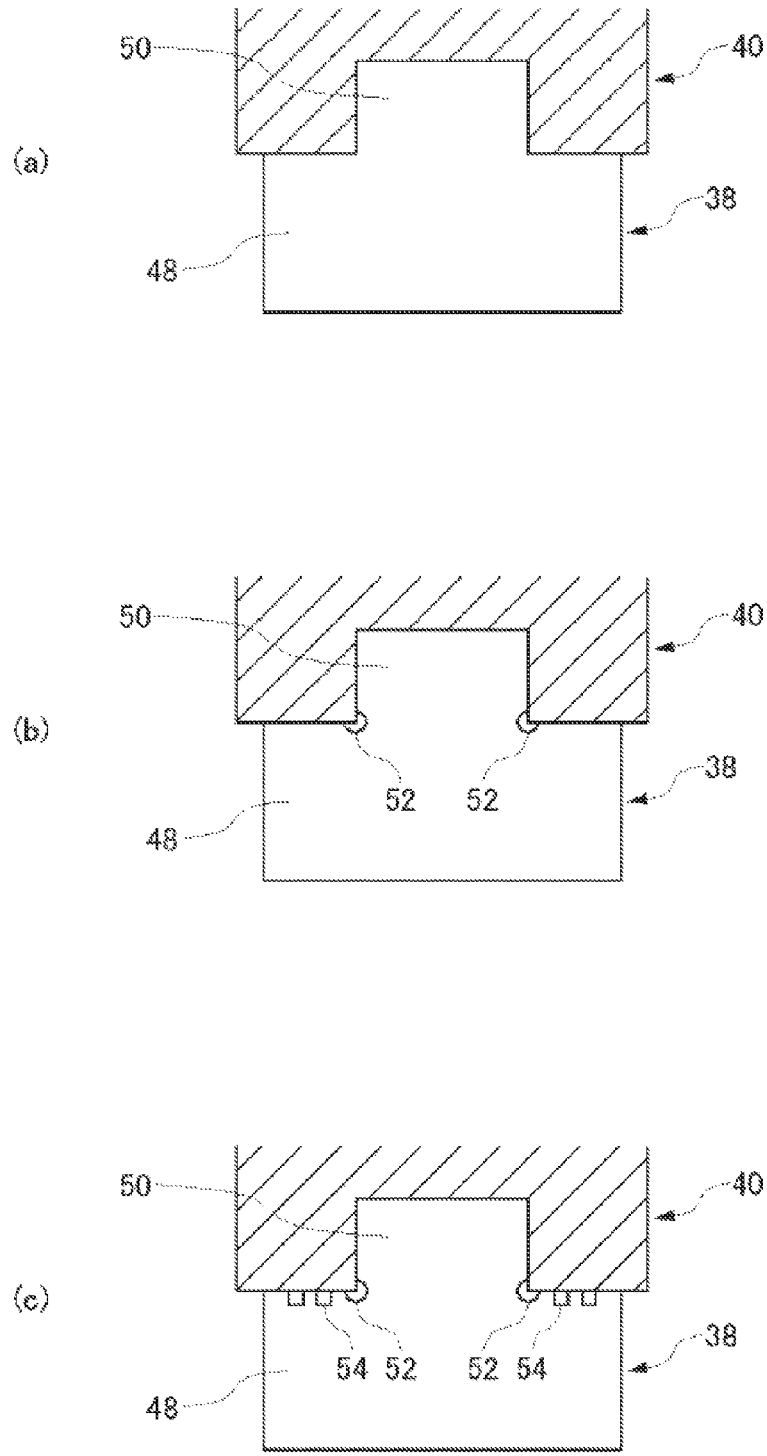
FIG. 6 is a side view of the cleaning sponge in the one embodiment.

FIGS. 5 to 7 are illustrations of the cleaning sponge 38 of this embodiment. As shown in FIG. 5, the cleaning sponge 38 includes a body portion 48 whose lower surface contacts with the front surface of the substrate W and a neck portion 50 that is provided to stand on an upper surface of the body portion 48 and is held by the holding member 40 (see FIG. 6 (a)). As shown in FIG. 6 (b), in a root end portion of the neck portion 50, a recess 52 may be provided. Also, as shown in FIG. 7, in the upper surface of the body portion 48, a concave and convex portion 54 (a concave portion or a convex portion) may be provided. Note that only one of the recess 52 in the neck portion 50 and the concave and convex portion 54 may be provided in the body portion 48, or both of them may be provided (see FIG. 6 (c)).

Figure 8:
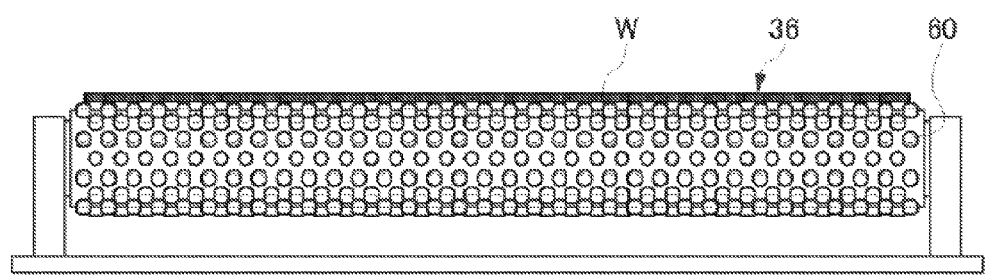
FIG. 8 is a side view of an elongated supporting member (roll member) in the one embodiment.
Figure 9:
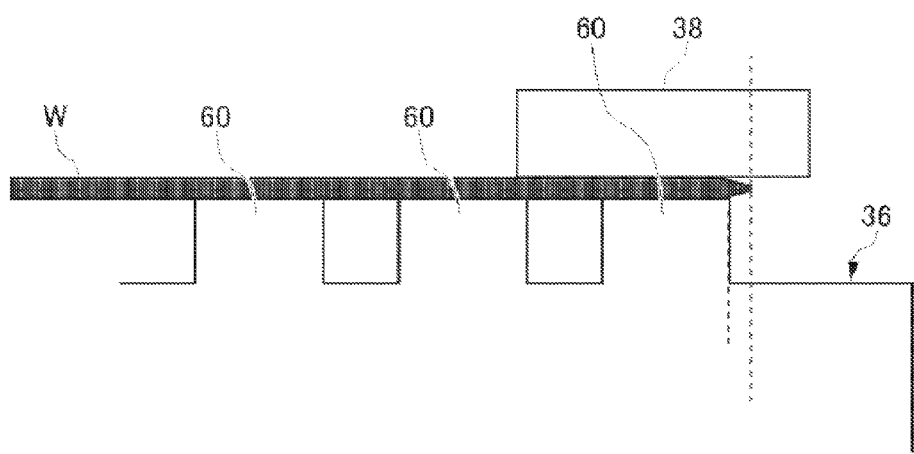
FIG. 9 is an enlarged view of the end portion of the elongated supporting member (roll member) in the one embodiment.

The elongated supporting member 36 includes, for example, a roll member. FIG. 8 is a side view of the elongated supporting member 36 and FIG. 9 is an enlarged view of the end portion of the roll member. As shown in FIG. 8, in a front surface of the roll member, a plurality of convex portions 60 are provided. And, as shown in FIG. 9, an outermost convex portion 60 of the plurality of convex portions 60 of the roll member (rightmost in FIG. 9) is situated on the inside of the outer circumferential portion of the substrate W.

Figure 10:
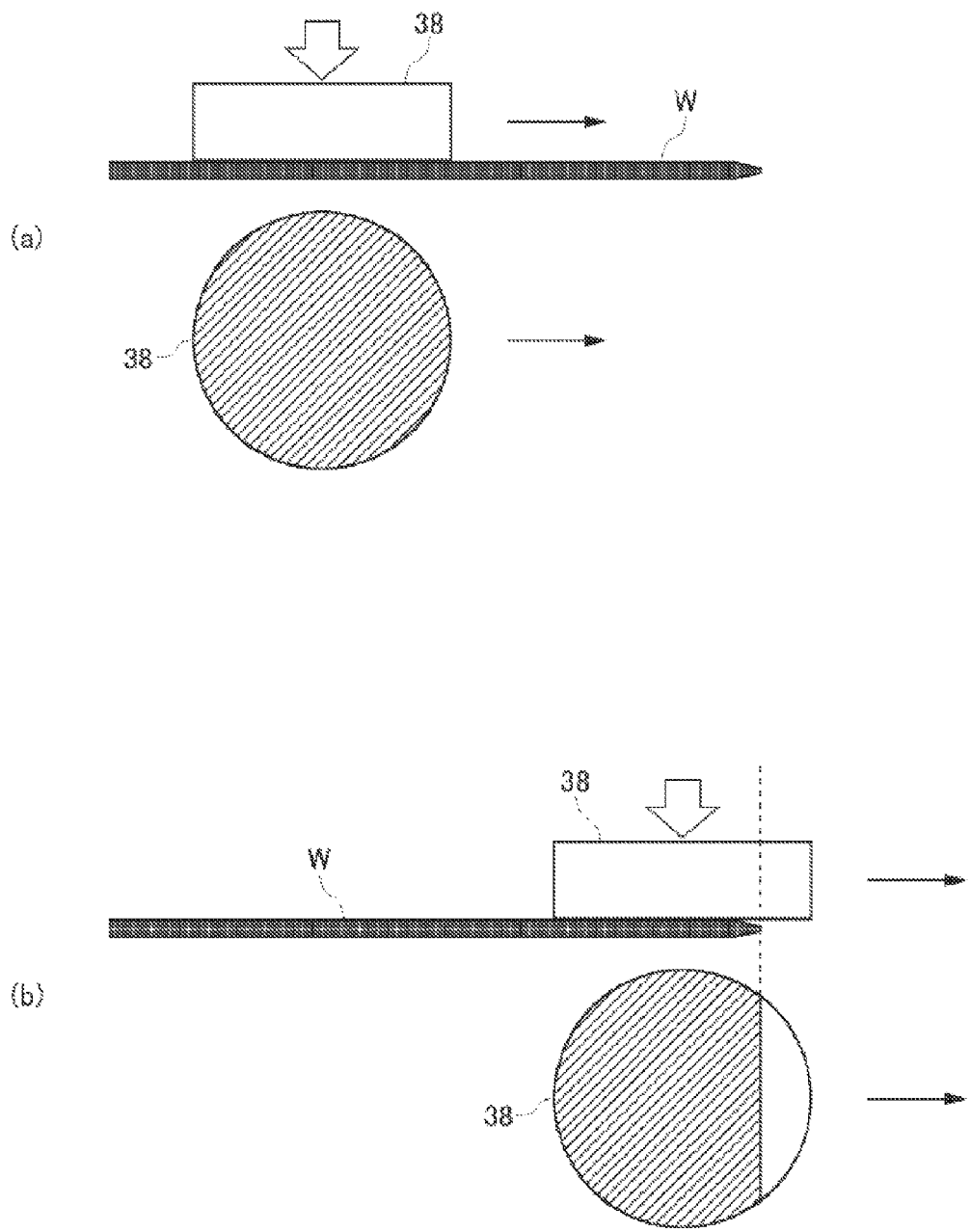
FIG. 10 is an illustration of pressing force control of the cleaning sponge in the one embodiment.

FIG. 10 is an illustration of pressing force control of the cleaning sponge 38 by the control portion 30. As shown in FIG. 10, when the cleaning sponge 38 protrudes from the outer circumference of the substrate W, the control portion 30, to make constant pressure by the cleaning sponge 38 on the substrate W, controls a pressing force by the cleaning sponge 38 on the substrate W depending on an area of the cleaning sponge 38 that contacts with the substrate W.

Figure 11:
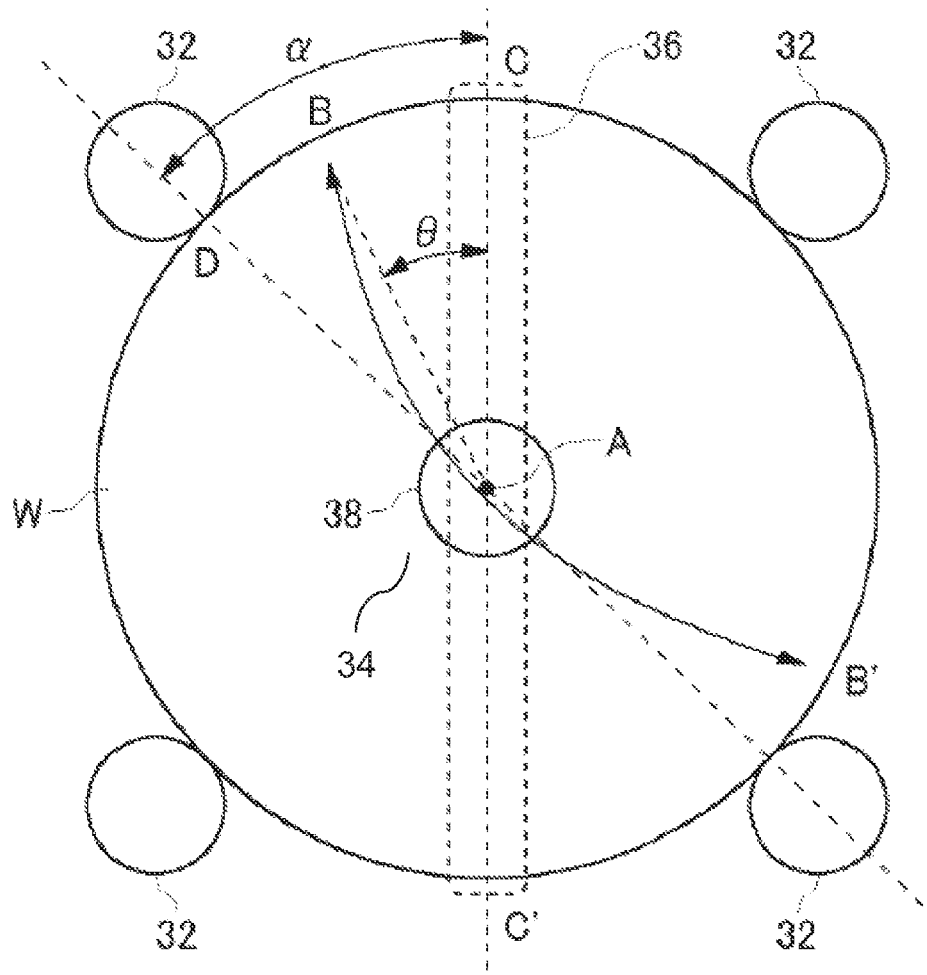
FIG. 11 is an illustration of operation of a swing cleaning member (pencil scrub cleaning member) in the one embodiment.

FIG. 11 is an illustration of operation of the swing cleaning member 34. As shown in FIG. 11, the swing cleaning member 34 swings in an arc-like manner between peripheral positions of both ends of the substrate W (first peripheral position B and second peripheral position B') while passing a center portion A of the substrate W. In such a situation, the elongated supporting member 36 extends long from a third peripheral position C to a fourth peripheral position C' of the substrate W so as to pass the center portion A of the substrate W.

The first peripheral position B is disposed between the third peripheral position C of the four outer circumference supporting members 32 and a position D of the outer circumference supporting member 32 and closest to the third peripheral position C (between the position C and the position D). Note that the second peripheral position B' may be disposed between the fourth peripheral position C' and a position D' of the outer circumference supporting member 32 of the plurality of outer circumference supporting members 32 and closest to the fourth peripheral position C' (between the position C' and the position D').

In other words, an angle θ formed between a line segment AB connecting the center position A and the first peripheral position B of the substrate W and a line segment AC connecting the center position A and the third peripheral position C of the substrate W is set to be not greater than an angle α formed between a line segment AD connecting the center position A of the substrate W and the position D of the outer circumference supporting member 32 and closest to the third peripheral position C and the line segment AC connecting the center position A and the third peripheral position C of the substrate W.

In such an embodiment, as shown in FIG. 11, the swing cleaning member 34 that cleans the front surface of the substrate W swings between the first peripheral position B and the second peripheral position B' while passing the center portion A of the substrate W, and the elongated supporting member 36 that supports the rear surface of the substrate W extends long from the third peripheral position C to the fourth peripheral position C' so as to pass the center portion A of the substrate W. Therefore, when the swing cleaning member 34 is situated at the center portion A of the substrate W, the substrate W is supported by the elongated supporting member 36 and can be prevented from becoming warped (into a concave shape). Also, in such a situation, the first peripheral position C is disposed between the position D of the outer circumference supporting member 32 of the four outer circumference supporting members 32 and closest to the third peripheral position C and the third peripheral position C. Therefore, also when the swing cleaning member 34 is disposed between the center portion A and the outer circumferential portion (first peripheral position C) of the substrate W, the substrate W is supported by the elongated supporting member 36 and the outer circumference supporting member 32 (the outer circumference supporting member 32 closest to the third peripheral position C), so that the degree to which the substrate W becomes warped (into a concave shape) can be lowered.

Also, in this embodiment, as shown in FIG. 6 (b), because the recess 52 is provided in the root end portion of the neck portion 50 of the cleaning sponge 38, the neck portion 50 easily deforms to fall on the body portion 48. That is, the cleaning sponge 38 is configured to easily deform so that the lower surface of the body portion 48 tilts in the state where the neck portion 50 is held by the holding portion. When the substrate W becomes warped (into a concave shape), a tilt of the front surface of the substrate W occurs, but, in such a situation, the lower surface of the body portion 48 of the cleaning sponge 38 can tilt to follow the tilt of the front surface of the substrate W, allowing a partial contact of the cleaning sponge 38 with the front surface of the substrate W to be suppressed.

Furthermore, in this embodiment, as shown in FIG. 7, because the concave and convex portion 54 (the concave portion or the convex portion) is provided in the upper surface of the body portion 48 of the cleaning sponge 38, the body portion 48 of the cleaning sponge 38 easily deforms to warp. More concretely, as shown in FIG. 7 (a), a convex portion 54 which extends in a radial direction of the cleaning sponge 38 is provided in the upper surface of the body portion 48 of the cleaning sponge 38. In the position which is subjected to an especially strong pressure from the holding member 40 in the upper surface of the body portion 48 of the cleaning sponge 38, the convex portion 54 is compressed. Alternatively, the portion 54 can be a concave portion which is relatively small in width. Further, as shown in FIG. 7 (b), a plurality of spotty convex portions 54 (island shaped convex portions 54) can be provided in the upper surface of the body portion 48 of the cleaning sponge 38. When the substrate W becomes warped (into a concave shape), a tilt of the front surface of the substrate W occurs, but, in such a situation, the body portion 48 of the cleaning sponge 38 deforms to warp, so that the cleaning sponge 38 can follow the tilt of the front surface of the substrate W, allowing a partial contact of the cleaning sponge 38 with the front surface of the substrate W to be suppressed.

Also, in this embodiment, as shown in FIG. 9, because the outermost convex portion of the plurality of convex portions in the front surface of the roll member (the outermost convex portion) is situated on the inside of the outer circumferential portion of the substrate W, the outer circumferential portion of the substrate W can be prevented from partially contacting with the convex portion (the outermost convex portion). The outer circumferential portion of the substrate W partially contacts with the convex portion (the outermost convex portion), thereby depressing the portion in the front surface of the convex portion (the outermost convex portion) and with which the outer circumferential portion of the substrate W contacts, eventually a step is formed in the front surface of the convex portion (the outermost convex portion). Once the step is formed in the front surface of the convex portion (the outermost convex portion) and the portion that does not contact with the outer circumferential portion of the substrate W protrudes above the substrate W, then the swing cleaning member 34 may be blocked by the protruding portion of the convex portion (the outermost convex portion) when the substrate W is cleaned to the outer circumferential portion by the swing cleaning member 34. According to this embodiment, the outer circumferential portion of the substrate W can be prevented from partially contacting with the convex portion (the outermost convex portion), allowing the substrate W to be cleaned to the outer circumference without blocking the swing cleaning member 34.

Also, in this embodiment, as shown in FIG. 10, when the swing cleaning member 34 protrudes from the outer circumference of the substrate W, the pressing force by the swing cleaning member 34 on the substrate W is controlled depending on the area of the swing cleaning member 34 that contacts with the substrate W, keeping constant the pressure by the swing cleaning member 34 on the substrate W. Therefore, the swing cleaning member 34 can be suppressed from breaking into the substrate due to an increased pressure, allowing the substrate W to be cleaned to the outer circumference.

As described above, an embodiment of the invention has been described using illustrative examples, but the scope of the invention should not be limited to these, and changes and modifications may be made depending on applications and within the scope defined by the claims.

Figure 12:
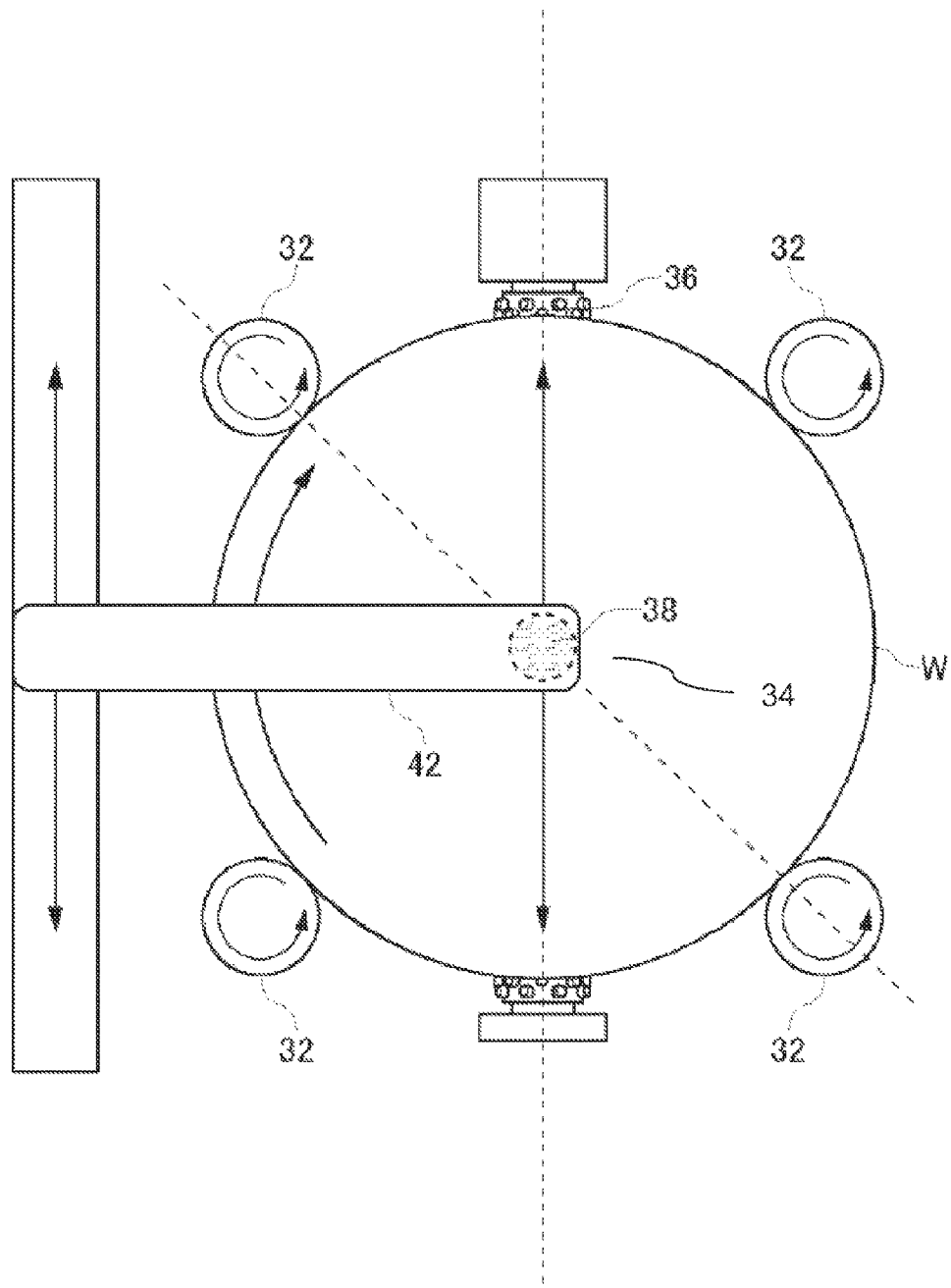
FIG. 12 is a plan view of a variation of the substrate cleaning apparatus (cleaning unit)
Figure 13:
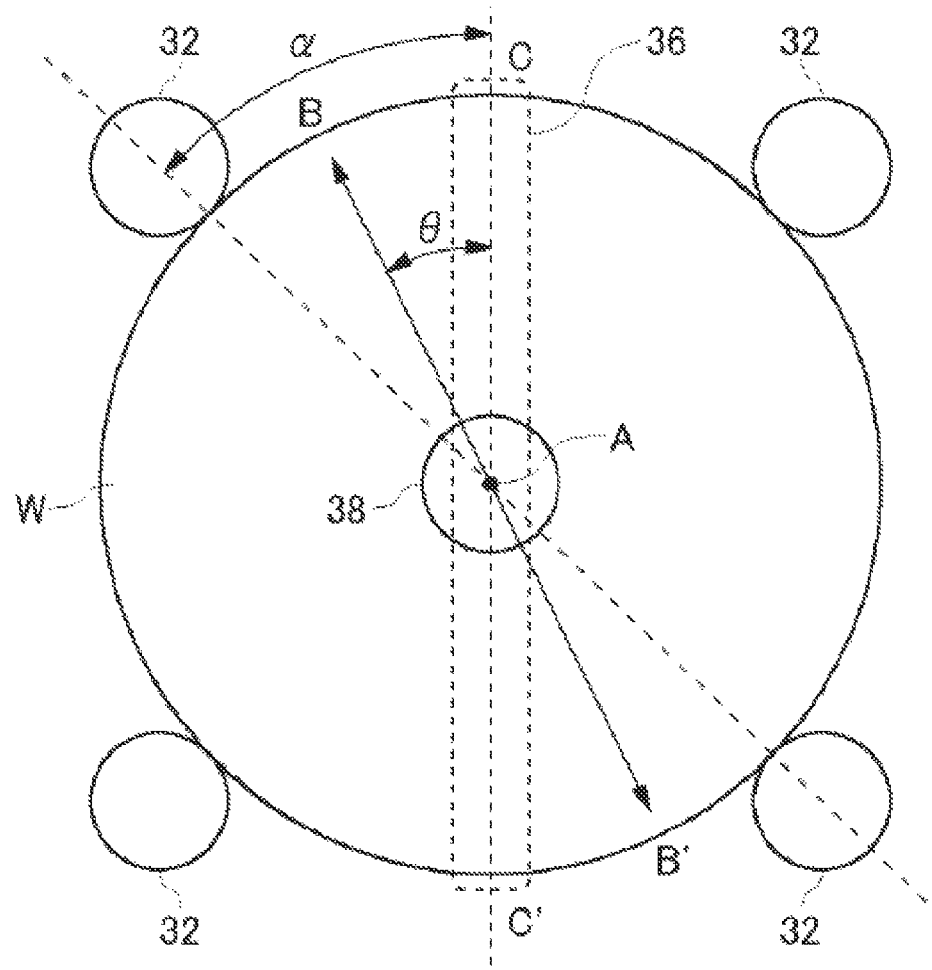
FIG. 13 is an illustration of operation of a swing cleaning member (pencil scrub cleaning member) in the variation of the substrate cleaning apparatus (cleaning unit)

For example, as shown in FIG. 12, the swing cleaning member 34 may be configured so that it swings on the substrate W in a linear manner to clean the front surface of the substrate W. That is, the swing cleaning member 34, as shown in FIG. 13, may swing in the linear manner between peripheral positions of both ends of the substrate W (first peripheral position B and second peripheral position B') while passing the center portion A of the substrate W. In such a situation, the first peripheral position B is disposed between the third peripheral position C of the four outer circumference supporting members 32 and the position D of the outer circumference supporting member 32 and closest to the third peripheral position C (between the position C and the position D). Also, the second peripheral position B' is disposed between the fourth peripheral position C' and the position D' of the outer circumference supporting member 32 of the plurality of outer circumference supporting members 32 and closest to the fourth peripheral position C' (between the position C' and the position D').

Also in this situation, the angle θ formed between the line segment AB connecting the center position A and the first peripheral position B of the substrate W and the line segment AC connecting the center position A and the third peripheral position C of the substrate W is set to be not greater than the angle α formed between the line segment AD connecting the center position A of the substrate W and the position D of the outer circumference supporting member 32 and closest to the third peripheral position C and the line segment AC connecting the center position A and the third peripheral position C of the substrate W (see FIG. 13).

Figure 14:
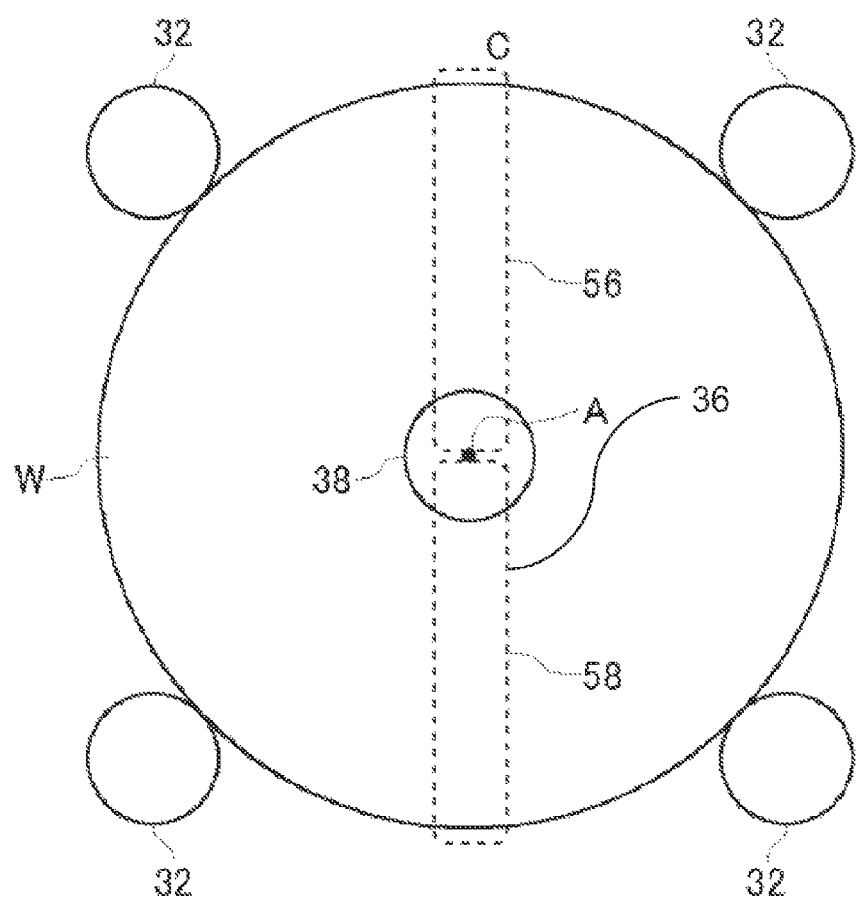
FIG. 14 is an illustration of a variation of the elongated supporting member (roll member)

Additionally, as shown in FIG. 14, the elongated supporting member 36 may include a first rotary roll member 56 from the center portion A to the third peripheral position C of the substrate W and a second rotary roll member 58 from the center portion A to the fourth peripheral position C' of the substrate W. In such a situation, a rotation direction of the first rotary roll member 56 and a rotation direction of the second rotary roll member 58 are set to be the same direction as a rotation direction of the substrate W.

As described above, if the elongated supporting member 36 includes the first rotary roll member 56 and the second rotary roll member 58, and the rotation direction of the first rotary roll member 56 and the rotation direction of the second rotary roll member 58 are set to be the same direction as the rotation direction of the substrate W, then the substrate W can be smoothly rotated without blocking rotation of the substrate W.

Figure 15:
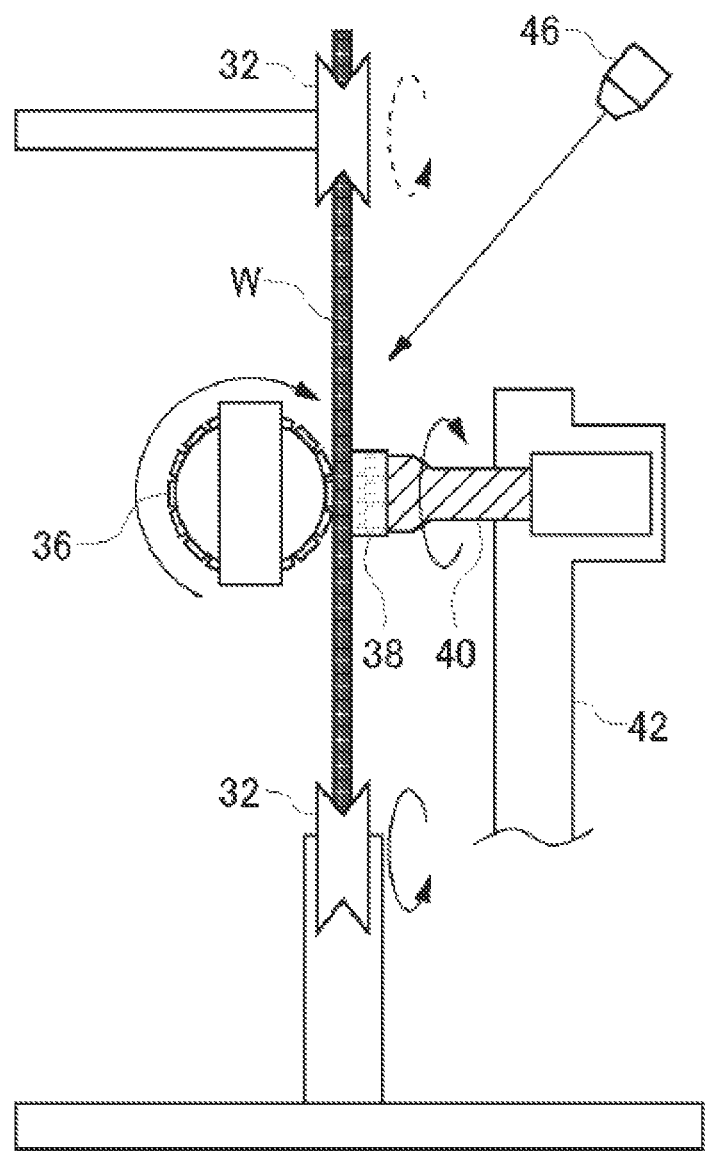
FIG. 15 is a side view of a variation of the substrate cleaning apparatus (cleaning unit)
Figure 16:
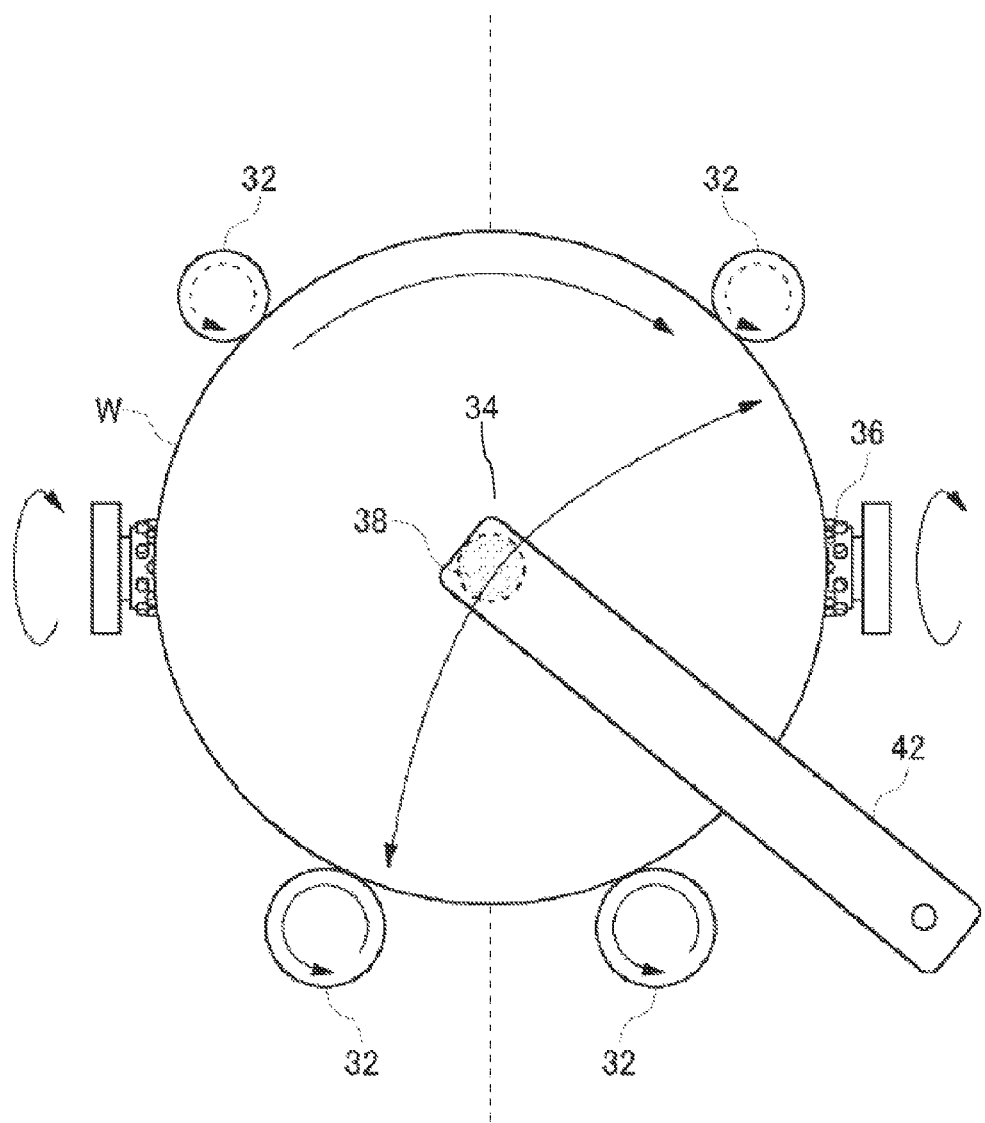
FIG. 16 is a plan view of a variation of the substrate cleaning apparatus (cleaning unit)
Figure 17:
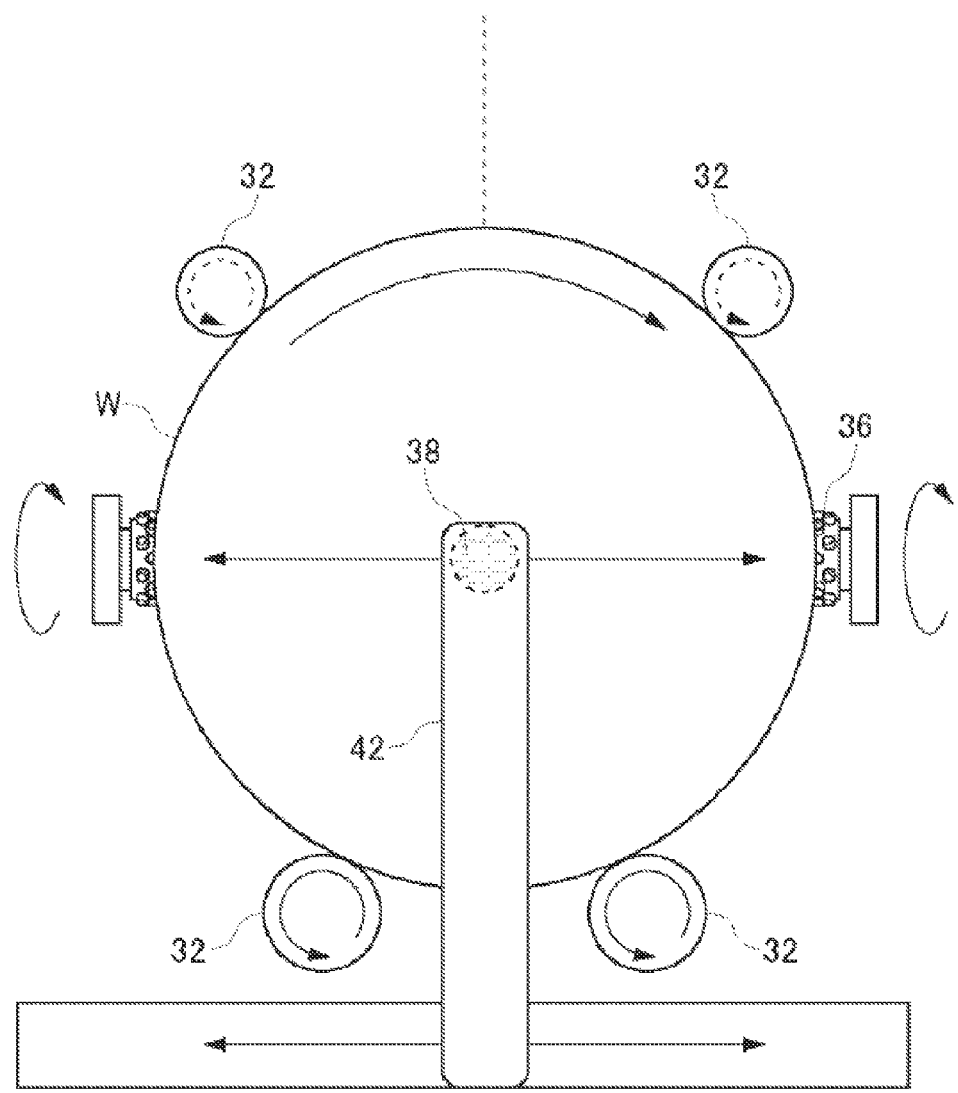
FIG. 17 is a plan view of a variation of the substrate cleaning apparatus (cleaning unit)
Figure 18:
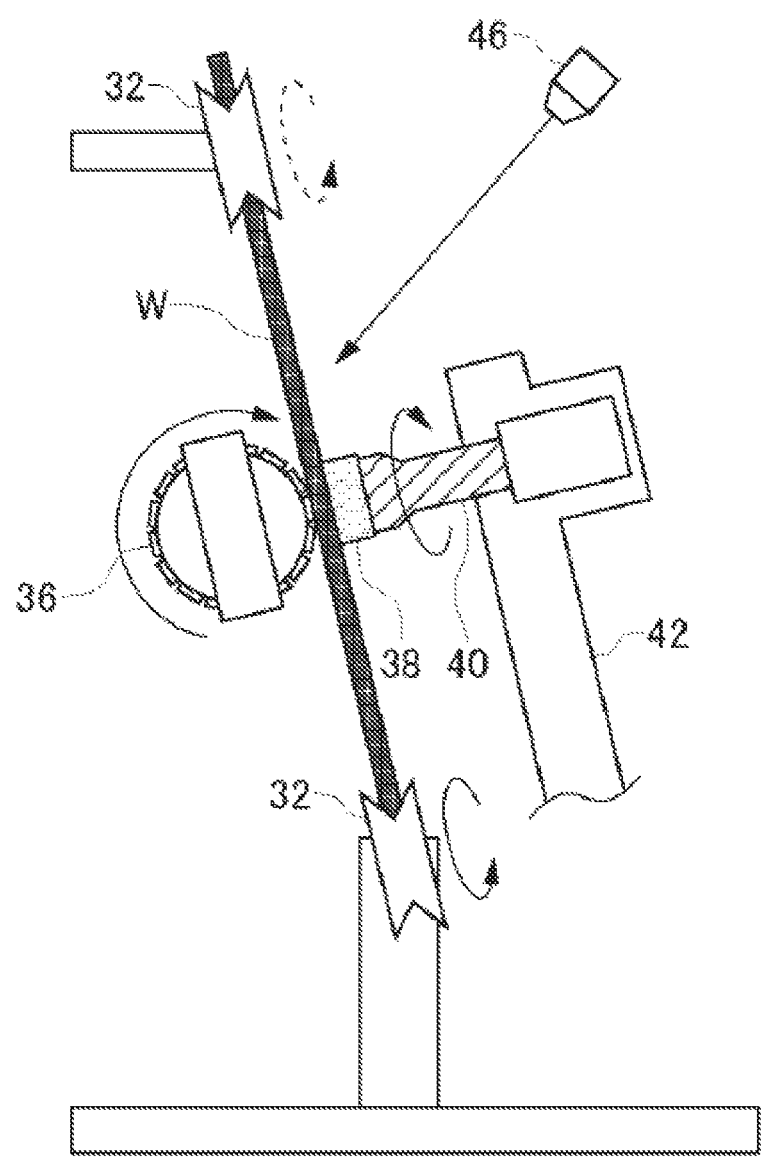
FIG. 18 is a side view of a variation of the substrate cleaning apparatus (cleaning unit).

Furthermore, the substrate cleaning apparatus, as shown in FIGS. 15 to 17, is also applicable to the situation where the substrate W is placed vertically. Also in the situation where the substrate W is placed vertically, similarly to the situation where the substrate W is placed flat in the horizontal direction, the swing cleaning member 34 may swing on the substrate W in the arc-like manner (see FIG. 16), or it may swing on the substrate W in the linear manner (see FIG. 17). In addition, the substrate cleaning apparatus, as shown in FIG. 18, is also applicable to the situation where the substrate W is placed obliquely. Note that in the situation where the substrate W is placed vertically or obliquely, the rotation direction of the elongated supporting member 36 is preferably set to be a direction in which the substrate W is pressed downward.

What is claimed is:

1. A substrate cleaning apparatus, comprising:
   a plurality of outer circumference supporting members that support outer circumference of a rotating substrate;
   a swing cleaning member that swings between a first peripheral position and a second peripheral position of the substrate while passing a center portion of the substrate to clean a front surface of the substrate, wherein the swing cleaning member comprises a flat bottom surface configured to clean the front surface of the substrate, and a portion of the flat bottom surface configured to clean the front surface protrudes from an outer circumference of the substrate when the swing cleaning member is at the first and the second peripheral positions;
   an elongated supporting member that extends long from a third peripheral position and a fourth peripheral position of the substrate so as to pass the center portion of the substrate and supports the rear surface of the rotating substrate, and
   a control portion that controls a pressing force by the swing cleaning member on the substrate depending on an area of the swing cleaning member that contacts with the substrate to make constant pressure by the swing cleaning member on the substrate when a portion of the flat bottom surface configured to clean the front surface of the substrate protrudes from the outer circumference of the substrate, wherein
   one of the first peripheral position and the second peripheral position is disposed between a position of an outer circumference supporting member closest to the third peripheral position and the third peripheral position, or between a position of an outer circumference supporting member closest to the fourth peripheral position and the fourth peripheral position.

2. The substrate cleaning apparatus according to claim 1, wherein
   an angle formed between a line segment AB connecting a center position A and a first peripheral position B of the substrate and a line segment AC connecting the center position A and a third peripheral position C of the substrate is set to be not greater than an angle formed between a line segment AD connecting the center position A of the substrate and a position D of the outer circumference supporting member and closest to the third peripheral position and the line segment AC connecting the center position A and the third peripheral position C of the substrate.

3. The substrate cleaning apparatus according to claim 1, wherein
   the swing cleaning member is a pencil scrub cleaning member, and
   the pencil scrub cleaning member comprises a cleaning sponge that contacts with the front surface of the substrate and a holding member that holds the cleaning sponge, wherein
   the cleaning sponge comprises a body portion whose lower surface contacts with the front surface of the substrate and a neck portion that is provided to stand on an upper surface of the body portion and is held by the holding member, and
   in a root end portion of the neck portion, a recess is provided, and in the upper surface of the body portion, a concave portion or a convex portion is provided.

4. The substrate cleaning apparatus according to claim 1, wherein
   the swing cleaning member is a pencil scrub cleaning member, and
   the pencil scrub cleaning member comprises a cleaning sponge that contacts with the front surface of the substrate and a holding member that holds the cleaning sponge, wherein
   the cleaning sponge comprises a body portion whose lower surface contacts with the front surface of the substrate and a neck portion that is provided to stand on an upper surface of the body portion and is held by the holding member, and
   in the upper surface of the body portion, a concave portion or a convex portion is provided.

5. The substrate cleaning apparatus according to claim 1, wherein
   the elongated supporting member is a roll member, and
   in a front surface of the roll member, a plurality of convex portions are provided, wherein
   an outermost convex portion of the plurality of convex portions is situated on the inside of an outer circumferential portion of the substrate.

6. The substrate cleaning apparatus according to claim 1, wherein
   the elongated supporting member comprises a first rotary roll member from the center portion to the third peripheral position of the substrate and a second rotary roll member from the center portion to the fourth peripheral position of the substrate, wherein
a rotation direction of the first rotary roll member and a rotation direction of the second rotary roll member are set to be the same direction as a rotation direction of the substrate.

7. A substrate cleaning apparatus, comprising:
a plurality of outer circumference supporting members that support outer circumference of a rotating substrate;
a swing cleaning member for oscillating from/to a first peripheral position of the substrate through a center portion of the substrate to clean a front surface of the substrate, wherein the swing cleaning member comprises a flat bottom surface configured to clean the front surface of the substrate, and a portion of the flat bottom surface configured to clean the front surface of the substrate protrudes from an outer circumference of the substrate when the swing cleaning member is at the first peripheral position;
an elongated supporting member that extends long from a third peripheral position and a fourth peripheral position of the substrate so as to pass the center portion of the substrate and supports the rear surface of the substrate, and
a control portion that controls a pressing force by the swing cleaning member on the substrate depending on an area of the swing cleaning member that contacts with the substrate to make constant pressure by the swing cleaning member on the substrate when a portion of the flat bottom surface configured to clean the front surface of the substrate protrudes from the outer circumference of the substrate, wherein
the first peripheral position is disposed between a position of an outer circumference supporting member closest to the third peripheral position and the third peripheral position, or between a position of an outer circumference supporting member closest to the fourth peripheral position and the fourth peripheral position.

* * * * *